United States Patent [19]
Plies

[11] Patent Number: 4,464,571
[45] Date of Patent: Aug. 7, 1984

[54] OPPOSING FIELD SPECTROMETER FOR ELECTRON BEAM MENSURATION TECHNOLOGY

[75] Inventor: Erich Plies, Munich, Fed. Rep. of Germany

[73] Assignee: Siemens Aktiengesellschaft, Berlin & Munich, Fed. Rep. of Germany

[21] Appl. No.: 409,630

[22] Filed: Aug. 19, 1982

[30] Foreign Application Priority Data

Sep. 30, 1981 [DE] Fed. Rep. of Germany ....... 3138901

[51] Int. Cl.$^3$ ............................................. H01J 49/44
[52] U.S. Cl. ..................................... 250/305; 250/310
[58] Field of Search ............................... 250/305, 310

[56] References Cited

U.S. PATENT DOCUMENTS 3,582,649 6/1971 Taylor ................................ 250/305

OTHER PUBLICATIONS

Balk et al., "Quantitative Voltage Contrast...", Scanning Electron Microscopy/1976 (Part IV), Apr. 1976, pp. 615–624.
"VLSI Testing Using the Electron Probe," H. P. Feuerbaum, Scanning Electron Microscopy/1979/I, pp. 285–296.
"A Retarding Potential Field Electron Emission Spectrometer," C. Workowski, J. Phys. E: Sci. Instrum., vol. 13, 1980, pp. 67–73.

Primary Examiner—Alfred E. Smith
Assistant Examiner—Jack I. Berman
Attorney, Agent, or Firm—Hill, Van Santen, Steadman & Simpson

[57] ABSTRACT

An improved electrostatic opposing field spectrometer of the type which may be utilized for undertaking measurements with an electron beam probe has an extraction electrode and an opposing field electrode and two spherical networks for generating a spherically symmetrical opposing field, the lower spherical network being at substantially the same potential as the extraction electrode and the upper spherical network being at a potential in the range of approximately 15 through −15 volts. The spherical network permit transmission of a large solid angle distribution of the secondary electrons emitted at the test point on the surface of a specimen. The centers of both spherical networks may be coincident at an imaginary source point.

6 Claims, 3 Drawing Figures

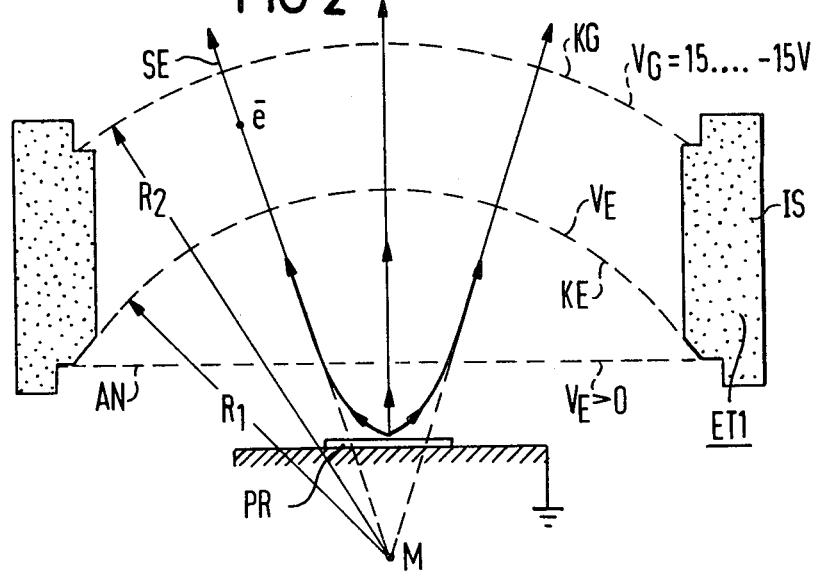
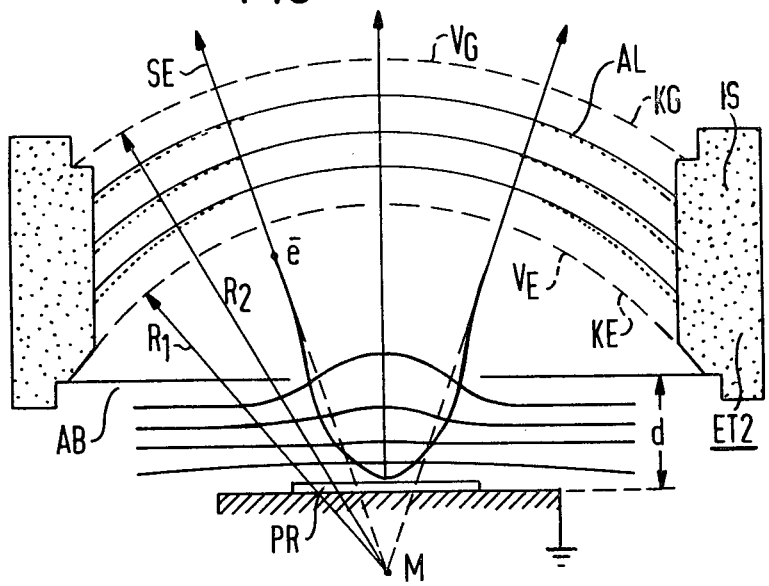

OPPOSING FIELD SPECTROMETER FOR ELECTRON BEAM MENSURATION TECHNOLOGY

BACKGROUND OF THE INVENTION

1. Field of the Invention

The present invention relates to opposing field spectrometers of the type which may be utilized to undertake measurements utilizing an electron beam probe.

2. Description of the Prior Art

The use of a spectrometer having an electrion beam probe to conduct voltage measurements at various test points on the surface of a specimen, such as voltage measurement at tracks and nodes of integrated microelectronic components, is becoming wide spread.

In such an electron beam test installation, the test points to be measured on a specimen surface are irradiated with primary electrons causing the release or emission of secondary electrons. Depending upon the voltage which is present at the test point, the energy distribution function of the secondary electrons is altered. This change in the energy distribution function of the secondary electrons can be determined in a spectrometer for such secondary electrons, and thus the voltage which is present at the test point can be ascertained. A spectrometer which may be utilized in such an electron beam test installation is described in the article "VLSI Testing Using the Electron Probe", by H. P. Feuerbaum, Scanning Electron Microscopy/1979/I, at pages 285-296. The spectrometer described therein, however, cannot transmit the entire solid angle distribution of the secondary electrons emitted at the test point, thus causing a measuring error in the range of 5% to 10%. This measuring error primarily results from the fact that an electron obliquely approaching the planar opposing field network or electrode with a specific energy may, under certain conditions, no longer pass the opposing field lattice, whereas an electron of the same energy moving perpendicularly relative to the opposing field network may still have enough energy to minimally pass the opposing field network.

The general concept of a spherical network in other types of spectrometers is described in, for example, the article by C. J. Workowski in the Journal of Physics, E13(1980) beginning at page 67.

SUMMARY OF THE INVENTION

It is an object of the present invention to provide an electrostatic opposing field spectrometer for secondary electron measurement which permits transmission of a larger solid angle distribution of the secondary electrons emitted at the test point of a specimen than was heretofore achieveable.

The above object is inventively achieved in an electrostatic opposing field spectrometer having two spherically symmetrical electrode or network elements which generate a spherically symmetrical opposing field, with the lower spherically symmetrical electrode being at a potential which is substantially equal to the potential of the extraction electrode in the spectrometer, and the upper spherical electrode is at a potential in the range of −15 through 15 volts. The spherically symmetrical electrodes may have respective radii of curvature such that their centers are dispsed in a plane containing an imaginary source point for the secondary electrons. The extraction electrode may be in the form of a pinhole diaphragm or may be an extraction network.

BRIEF DESCRIPTION OF THE DRAWINGS

FIG. 2 is an enlarged sectional view of the operative portion of an opposing field spectrometer constructed in accordance with the principles of the present invention.

FIG. 3 is an enlarged sectional view of the operative portion of a second embodiment of an opposing field spectrometer constructed in accordance with the principles of the present invention.

DESCRIPTION OF THE PREFERRED EMBODIMENTS

Figure 1:
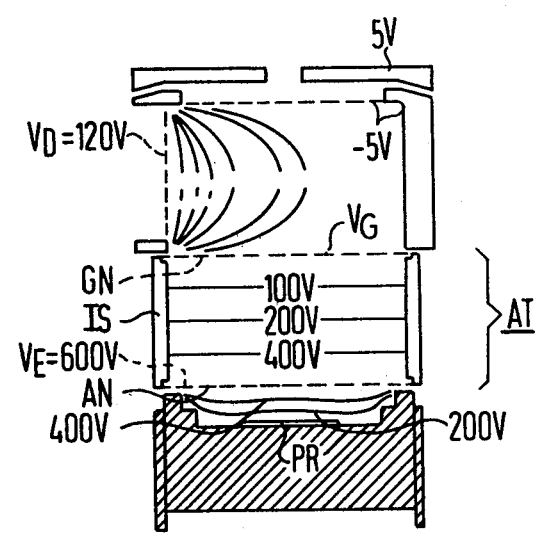
FIG. 1 is a side view of a conventional secondary electron spectrometer of the type which is known in the art.

A conventional opposing field spectrometer of the type which is described in the Feuerbaum article identified above is shown in FIG. 1. This conventional spectrometer has an extraction network AN, an opposing field network GN and an insulator IS. These elements comprise a portion AT of the spectrometer which is replaced by the inventive structures ET1 shown in FIG. 2 or ET2 shown in FIG. 3, as more fully described below.

The portion AT is disposed above a specimen PR, such as an integrated circuit chip, having integrated tracks and nodes thereon, the spectrometer being utilized to determine the voltages at various points on the specimen PR. Lines of equipotential immediately above the specimen PR and below the extraction electrode AN are shown as, for example, 200 volts and 400 volts. Approximate lines of equipotential in the retarding field formed in the portion AT between a lower voltage of $V_E$ which may be, for example, 600 volts and an upper voltage $V_G$, which may be, for example, 0 volts, are also shown. The section of the spectrometer above the section AT generates a deflection field for directing the secondary electrons to a detector.

A first embodiment of the operative portion of an electrostatic opposing field spectrometer constructed in accordance with the principles of the present invention is shown in FIG. 2, generally referenced at ET1, which may replace the portion AT of the spectrometer shown in FIG. 1. The spectrometer shown in FIG. 2 has a spherically symmetrical opposing field generated by two spherical networks or electrodes KG and KE. The extraction network AN is disposed parallel to the specimen PR. The lower spherical network KE is at the same potential $V_E$ as the extraction network AN. A field-free space thereby arises directly below the spherical network KE. The upper spherical network KG functions as an opposing field lattice and has a potential $V_G$ of approximately −15 through 15 volts. In order to insure that the trajectories SE of the secondary electrons in the opposing field in fact proceed parallel to the field lines, the centers of both the spherical networks KE and KG are disposed in a plane also containing an imaginary or virtual source point M for the secondary electrons. In a non-activated state, the test points on the surface of the specimen PR are at zero potential. The lower spherical network KE has a radius $R_1$ and the upper spherical network KG has a radius $R_2$.

A second embodiment of an electrostatic opposing field spectrometer in accordance with the principles of the present invention is shown in FIG. 3, which may also replace the section AT of the spectrometer shown in FIG. 1. In the embodiment of FIG. 3, the extraction network or electrode is in the form of an extraction diaphragm AB disposed parallel to the specimen PR. As in the embodiment of FIG. 2, the spectrometer has a lower spherical network KE having a radius $R_1$, an upper spherical network KG having a radius $R_2$, and an insulator IS. In the embodiment of FIG. 3, the equipotential surfaces between the spherical networks KE and KG are not strictly spherical in the proximity of the insulator IS but are instead slightly attracted in the direction of the upper spherical network KG by the more linear potential drop at the surface of the insulator IS. This may occur as well in the embodiment shown in FIG. 2 wherein the potential surfaces in the proximity of the insulator IS are attracted upward in the direction of the upper spherical network KG.

In the embodiment of FIG. 3 a spherically symmetrical opposing field is also generated by the spherical networks KE and KG, with the lower spherical network KE being at substantially the same potential $V_E$ as the extraction diaphragm AB. The upper network KG will again have a voltage $V_G$ in the range of $-15$ through 15 volts. In order that the trajectories SE of the secondary electrons in the opposing field proceed parallel to the field lines, the centers of both of the spherical networks KE and KG are again situated in a plane containing an imaginary source point M for the secondary electrons. The extraction diaphragm AB imposes a lens effect in the embodiment of FIG. 3. The extraction diaphragm AB, which may be a pinhole diaphragm, acts as a diverging lens having a focal length which may be approximately specified by the Davisson-Calbic equation at $-4d$, where d is the spacing between the specimen PR and the extraction diaphragm AB.

Although the extraction electrode in the form of an extraction network AN and the extraction diaphragm AB are shown in the drawings to be planar, the inventive concept disclosed and claimed herein may be employed in combination with a non-planar extraction electrode.

Although other modifications and changes may be suggested by those skilled in the art it is the intention of the inventor to embody within the patent warranted hereon all changes and modifications which reasonably and properly come within the scope of his contribution to the art.

I claim as my invention:

1. In an electrostatic opposing field spectrometer for undertaking measurements by means of an electron beam probe at various points on a test specimen and having an extraction electrode, the improvement comprising:

an opposing field electrode for generating a spherically symmetric opposing field including a lower spherically symmetric network disposed above said specimen and being at a first potential, and an upper spherically symmetrical network disposed above said test specimen at a second potential and;

said extraction electrode being disposed parallel to said test specimen.

2. The improvement of claim 1 wherein said upper and lower spherically symmetrical networks have respective centers which are coincident with a plane containing an imaginary source point for the secondary electrons in said spectrometer.

3. The improvement of claim 1 wherein said extraction electrode is planar.

4. The improvement of claim 3 wherein said extraction electrode is a planar extraction diaphragm.

5. The improvement of claim 3 wherein said extraction electrode is a planar extraction network.

6. The improvement of claim 1 wherein said lower spherically symmetric electrode and said extraction electrode are at substantially the same potential.

* * * * *